(12) United States Patent
Pešic et al.

(10) Patent No.: US 11,856,879 B2
(45) Date of Patent: Dec. 26, 2023

(54) MIEC AND TUNNEL-BASED SELECTORS WITH IMPROVED RECTIFICATION CHARACTERISTICS AND TUNABILITY

(71) Applicant: Applied Materials, Inc., Santa Clara, CA (US)

(72) Inventors: Milan Pešic, Paoli, PA (US); Andrea Padovani, Reggio Emilia (IT); Bastien Beltrando, Marseilles (FR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/510,370

(22) Filed: Oct. 25, 2021

(65) Prior Publication Data

US 2022/0059764 A1 Feb. 24, 2022

Related U.S. Application Data

(63) Continuation of application No. 16/691,401, filed on Nov. 21, 2019, now Pat. No. 11,158,791.

(51) Int. Cl.
| | |
|---|---|
| *H01L 27/24* | (2006.01) |
| *G11C 5/06* | (2006.01) |
| *H01L 45/00* | (2006.01) |
| *H10N 70/00* | (2023.01) |

(Continued)

(52) U.S. Cl.
CPC ......... *H10N 70/8416* (2023.02); *G11C 5/063* (2013.01); *H01L 27/00* (2013.01); *H10B 63/80* (2023.02); *H10N 70/021* (2023.02); *H10N 70/041* (2023.02); *H10N 70/8833* (2023.02)

(58) Field of Classification Search
CPC ........... H01L 27/2463; H01L 27/11507; H01L 27/11585; H01L 27/11514; H01L 27/06; H01L 27/1207; H01L 27/156; H01L 27/088; G11C 5/063; G11C 5/06; G11C 5/00; H10N 70/8416; H10N 70/8833; H10N 70/021; H10N 70/041; H10B 63/80; H10B 63/20; H10B 63/845
See application file for complete search history.

(56) References Cited

U.S. PATENT DOCUMENTS

| | | |
|---|---|---|
| 7,656,696 B2 | 2/2010 | Joo et al. |
| 9,466,791 B2 | 10/2016 | Sei et al. |
| 10,297,312 B1 * | 5/2019 | Futase ................. H01L 45/1226 |

(Continued)

OTHER PUBLICATIONS

Electron Work Function of the elements, https://public.wsu.edu/~pchemlab/documents/Work-functionvalues.pdf (Year: 2020).

(Continued)

*Primary Examiner* — Nikolay K Yushin
(74) *Attorney, Agent, or Firm* — Kilpatrick Townsend & Stockton LLP (57) ABSTRACT

A selector device for a memory cell in a memory array may include a first electrode, and a separator that include a first region of a single-composition layer of a mixed ionic-electronic conduction material with a first concentration of defects; and a second region of a single-composition layer of a transitional metal oxide with a second concentration of defects that is different from the first concentration of defects. The selector device may also include a second electrode, where the separator is between the first electrode and the second electrode.

16 Claims, 10 Drawing Sheets

(51) Int. Cl.
 *H10B 63/00* (2023.01)
 *H01L 27/00* (2006.01)

(56) References Cited

U.S. PATENT DOCUMENTS

2006/0181317 A1   8/2006   Joo et al.
2013/0256622 A1   10/2013   Sei et al.
2019/0172532 A1*   6/2019   Futase ................ G11C 13/0011

OTHER PUBLICATIONS

Lima, et. al., Metal gate work function tuning by Al incorporation in TiN, 2014, Journal of Applied Physics 115, 074504, pp. 1-5, published Feb. 21, 2014.

* cited by examiner

MIEC AND TUNNEL-BASED SELECTORS WITH IMPROVED RECTIFICATION CHARACTERISTICS AND TUNABILITY

CROSS-REFERENCE TO RELATED APPLICATIONS

This application is a continuation of U.S. application Ser. No. 16/691,401, filed Nov. 21, 2019, which is incorporated here by reference.

BACKGROUND

Modern semiconductor-based memory devices can be tightly packed into integrated circuit packages. To maximize the memory cell density on the integrated circuit, these memory cells may be arranged in rectangular arrays such that individual memory cells can be accessed by a plurality of word lines traversing the array in one direction, along with a plurality of bit lines traversing the array in a second direction that is perpendicular to the word lines. By applying a voltage to a particular word line and a particular bit line, a single memory cell in the memory array can be selected for a read or write operation.

Recently, memory arrays have started transitioning away from traditional flash memories in favor of more modern memories that promise to be smaller, more reliable, and more energy-efficient. For example, phase-change memories (PCMs) quickly heat and/or quench a phase-change material to save a logic value. In another example, resistive memories (ReRAMs) implement a non-volatile random-access memory cell by changing a resistance across the dielectric solid-state material. ReRAMs in particular demonstrate favorable results for use in large-scale memory arrays. However, efficiently implementing ReRAMs in commercial semiconductor devices has been met with difficulties that have prevented their widespread use. Therefore, improvements in the devices used in ReRAM memory arrays are needed.

SUMMARY

In some embodiments, a selector device for a memory cell in a memory array may include a first electrode, a second electrode, and a separator between the first electrode and the second electrode. The separator may include a mixed ionic-electronic conduction material with first ions that may include a first charge such that the first ions may respond to a voltage applied between the first electrode and the second electrode by moving away from the first electrode. The separator may be doped near the second electrode with second ions having a second charge that opposes the first charge.

In some embodiments, a method of implementing a selector device for a memory cell in a memory array may include depositing a second metal layer to form a second electrode. The method may also include depositing a separator on top of the second electrode, where the separator may include a mixed ionic-electric conduction material comprising first ions having first charge. The method may also include doping the separator with second ions having a second charge that opposes the first charge, and depositing first metal layer to form a first electrode. The separator may be doped with the second ions near the second electrode. The first ions may respond to a voltage applied between the first electrode and the second electrode by moving away from the first electrode.

In any embodiments, any of the following features may be implemented in any combination and without limitation. The first electrode may include a first material, and the second electrode may include a second material that is different from the first material. The first material may have a first work function, and the second material may have a second work function that is different from the first work function. A difference between the first work function and the second work function may cause an electric field between the first electrode and the second electrode that opposes the voltage applied between the first electrode and the second electrode. A difference between the first work function and the second work function may cause a voltage at which the selector device begins to conduct to increase. The first material may include Ag, Ti, TiN, TiSi, TiAlN, TaN, TaCN, TaSi, W, WSi, WN, Al, Ru, Re, In2O3, InSnO, SnO, ZnO, Ti, Ni, NiSi, Nb, Ga, GaN, C, Ge, Si, doped Si, SiC or GeSi; and the second material may include Pd, RuO, RuO2 IrO, IrO2, Ir, Pt, Au, or Ni. The separator may include germanium telluride. The second ions may have a higher mass than the first ions. The second ions may remain relatively fixed in place when the voltage is applied between the first electrode and the second electrode, and the first ions may move toward the second electrode when the voltage is applied between the first electrode and the second electrode. The separator may be doped near the first electrode with the second ions having a fixed-charge density of approximately 1e19 per $cm^3$. The method may also include doping the separator with third ions near the first electrode, wherein the third ions have the first charge. The third ions may have a higher mass than the first ions. A concentration of the second ions in the separator may be selected to increase a rate at which the first ions move back towards the first electrode when the voltage is no longer applied between the first electrode and the second electrode. The concentration of the second ions in the separator may be selected based on a response of a non-volatile memory cell to the voltage, where the non-volatile memory cell may be coupled to the selector device in a memory array. The non-volatile memory cell may include a resistive random-access memory (ReRAM). The memory array may include at least one write line electrically coupled to the first electrode, and at least one bit line electrically coupled to the second electrode such that the voltage applied between the first electrode and the second electrode is supplied by the at least one write line and the at least one bit line. A thickness of the separator may be selected based on an amount by which a leakage current is to be reduced through the selector device. An ion density for the first ions may be approximately 1e20 per $cm^3$. The method may additionally include depositing a transition metal oxide layer between the separator and the first electrode.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an FIG. 1 illustrates a non-volatile memory array, according to some embodiments.

DETAILED DESCRIPTION

Described herein are embodiments for a selector device for a memory cell in a memory array that includes a first electrode, a second electrode, and a separator between the first electrode and the second electrode. The separator includes a mixed ionic-electronic conduction material with first ions having a first charge such that the first ions respond to a voltage applied between the first electrode and the second electrode by moving away from the first electrode. The separator is doped near the second electrode with second ions having a second charge that opposes the first charge.

Figure 1:
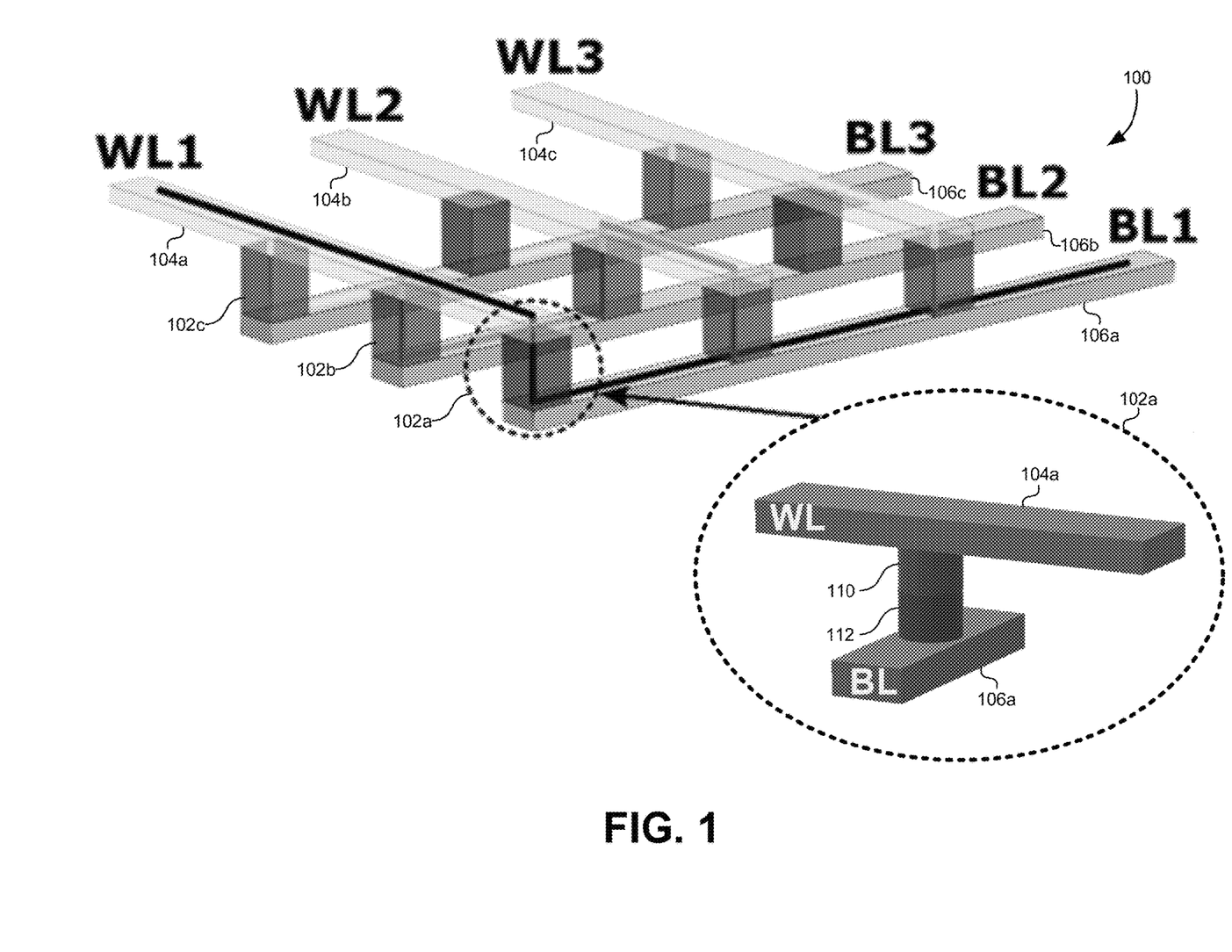

FIG. 1 illustrates a non-volatile memory array 100, according to some embodiments. The memory array is comprised of a plurality of memory elements 102 arranged in a rectangular grid pattern. Each of the memory elements 102 may be configured to receive a voltage applied across the memory elements 102. Based on the polarity of the voltage applied, the memory elements 102 may change a physical state of a material in the memory element to represent a saved logic state, such as a logic 1 and a logic 0. When the voltage is no longer applied, the memory elements 102 may save the logic state induced by the applied voltage, and thus may operate as non-volatile memory elements.

In order to apply the voltage needed to read/write to the memory elements 102, a plurality of word lines 104 may be deposited as linear traces on top of the memory elements 102. The linear traces of the word lines 104 may run parallel to each other at regular intervals such that they each intersect with a single row of the memory elements 102. Similarly, a plurality of bit lines 106 may also be provided as linear traces that are deposited under the memory elements 102. These bit lines 106 may also run parallel to each other at regular intervals such that they each intersect with a single column of memory elements 102. The bit lines 106 may run perpendicular to the word lines 104. Therefore, applying a voltage between a single one of the word lines 104 and a single one of the bit lines 106 may cause voltage to be applied across a single one of the memory elements 102. This process can be used to select a single one of the memory elements 102 for a read and/or write operation.

One of the problems with using memory arrays similar to the memory array 100 depicted in FIG. 1 involves the creation of leakage current path through non-selected memory cells during a read and/or write operation. During either of these operations, a voltage may be applied to a single one of the word lines 104 and a single one of the bit lines 106 as described above. Thus, while only a single one of the memory elements 102 receives the full voltage differential between the selected word line and the selected bit line, many other memory elements in the memory array 100 may receive approximately half of that voltage differential during the operation.

For example, when selecting memory element 102a, a voltage differential can be applied across word line 104a and bit line 106a. In some embodiments, word line 104a may apply $V_{DD}/2$ and bit line 106a may apply $-V_{DD}/2$, resulting in a full $V_{DD}$ differential across memory element 102a. While this voltage differential is applied, many other memory cells in the memory array 100 may be connected to one of word line 104a or bit line 106a, but not both. Therefore, these other memory elements that are connected to either write line 104a or bit line 106a may experience a $\pm V_{DD}/2$ differential. For example, memory element 102b and memory element 102c may experience this half-voltage differential because they are electrically coupled to word line 104a. While this half-voltage differential is not sufficient to change the state of these other memory elements 102b, 102c, it may be sufficient to generate a significant amount of leakage current through these other memory elements. For example, the modeled resistance of these other memory elements may be reduced to generate series/parallel low-resistance connections between word line 104a and bit line 106a. These leakage current paths are commonly referred to as "sneak paths" as they generate a large power dissipation of the array and represent one of the main difficulties in designing crossbar memory arrays.

To minimize the leakage current through the memory array 100, the memory elements 102 may each include devices that limit leakage current unless the full $V_{DD}$ voltage is applied. For example, FIG. 1 depicts a detailed view of memory element 102a. In some embodiments, the memory element 102a may include a memory cell 112 and a selector device 110. Many different technologies may be used to implement the memory cell 112. For example, some embodiments may use resistive random-access memory (ReRAM) cells as non-volatile memory elements to store a logic state.

The selector device 110 may be implemented between the memory cell 112 and the word line 104a or between the memory cell 112 and the bit line 106a. The selector device 110 may be configured to prevent current from leaking through the memory element 102a unless a voltage at least greater than the +/−$V_{DD}$/2 voltage described above is received by the memory element 102a. Therefore, when the voltage is applied to word line 104a and bit line 106a, the selector devices in memory element 102b and memory element 102c may prevent any significant amount of leakage current from flowing through these memory elements using the embodiments described herein. This may also prevent a large power dissipation in the array along with "disturbances" (i.e. undesired disturbances of the stored state in the non-accessed memory element sharing the same bit line or word line with the accessed cell).

The proper matching of a selector device 110 with the memory cell 112 is a difficult problem that is solved by the embodiments described herein. Because the memory cell 112 typically has a nonlinear response to applied voltages, the selector device 110 should also be implemented to generate a nonlinear response. Furthermore, when these nonlinear responses are combined in the memory element 102a, the overall response to applied voltages should be configured to minimize leakage current while not interfering with normal read/write operations. The embodiments described herein propose a number of designs and techniques to properly adjust the nonlinear response of the selector device 110 to produce an overall nonlinear response for the memory element that optimally reduces leakage current without interfering with normal operation.

Figure 2:
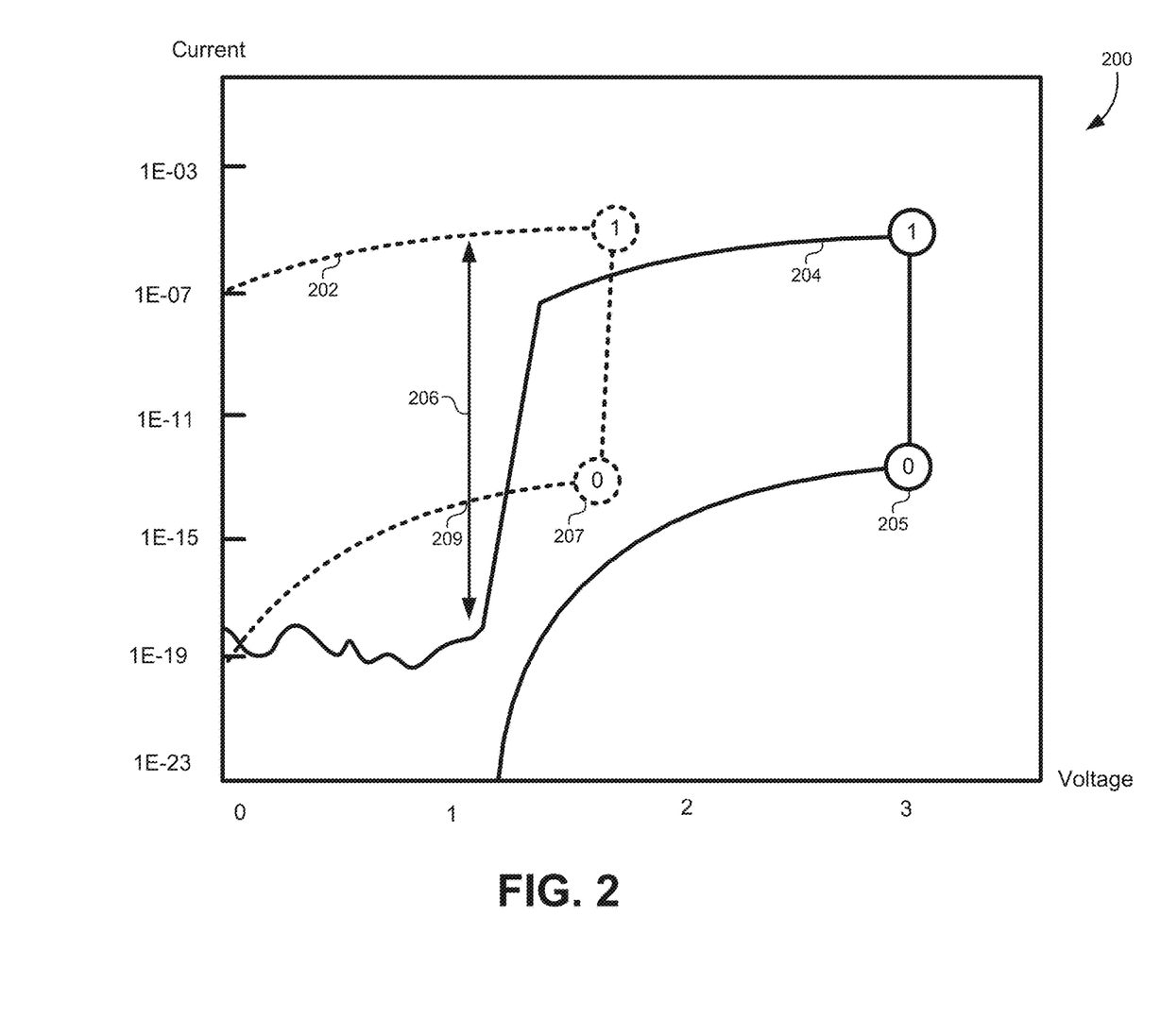
FIG. 2 illustrates nonlinear responses of memory cells with and without selector devices, according to some embodiments.

FIG. 2 illustrates nonlinear responses of memory cells with and without selector devices, according to some embodiments. Signal 202 represents the nonlinear response of a memory cell without a selector device. Voltage 207 represents the voltage at which the memory cell alone will switch between logic 0 and logic 1 states. Voltage 209 represents the voltage that may be incidentally applied to the memory cell when another memory element in the same word row or bit column is being selected. When the memory cell is in the logic 0 state, the leakage current at voltage 209 is fairly small. However, when the memory cell is in the logic 1 state, the leakage current at voltage 209 may be relatively large compared to the leakage current from the logic 0 state. Without the selector device, selected rows/columns in the memory array that include a large number of memory cells storing a logic 1 may induce significant leakage current during read/write operations. Note that logic 1 and logic 0 are interchangeable as a convention. Here, a low-resistance state (high-leakage state) of the memory element denotes a logic 1, and a high-resistance state (low-leakage state) of the memory element denotes a logic 0.

Curve 204 represents an optimized nonlinear response from a combination of a memory cell and a selector device using the embodiments described below. The effect of adding the selector device has changed the shape of the response signal 204 to significantly reduce leakage current in either logic state when the memory element is not (or half) selected. For example, adding the selector device has shifted the response signal 204 to the right due to the serial resistance caused by the selector in series such that larger voltages may be required before any leakage current is induced. In addition, adding the selector device (characterized by highly nonlinear characteristics that possess very low resistance at lower voltages and very low resistance at the higher voltages above the threshold of the selector) has also caused the leakage current in the logic 1 state to drop down to a negligible level at voltage levels below voltage 209 that may be experienced when selecting another memory cell in the same row/column.

Figure 3A:
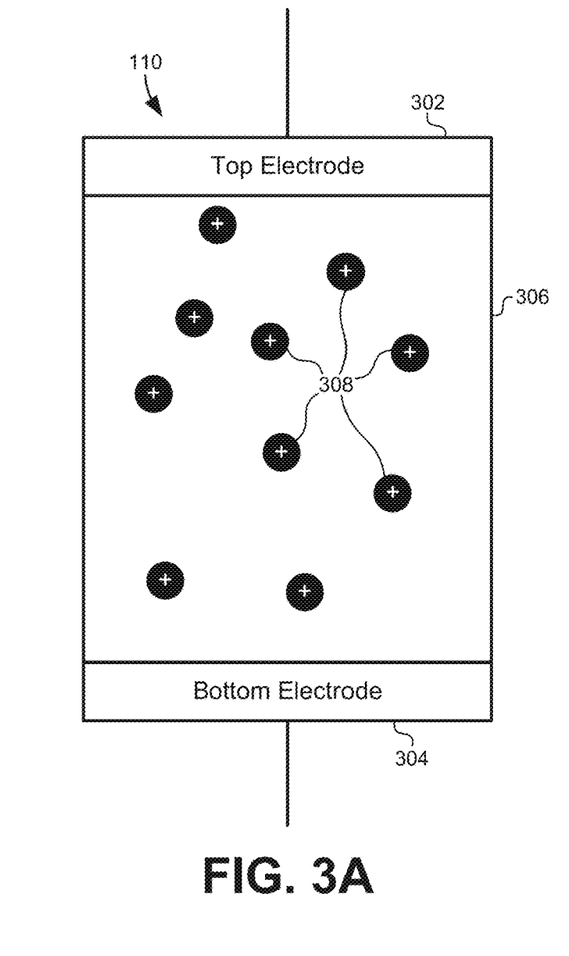
FIG. 3A illustrates a simplified diagram of a selector device, according to some embodiments.

FIG. 3A illustrates a simplified diagram of a selector device 110, according to some embodiments. The selector device 110 may include a top electrode 302 and a bottom electrode 304. Labeling these electrodes 302, 304 as "top" and "bottom" is done merely to utilize a standard convention in this area of circuit design. These labels do not necessarily require that the bottom electrode 304 be on a bottom side of the selector device 110, nor do they require that the top electrode 302 be on a top side of the selector device 110. Instead, these labels should be interpreted merely to distinguish the top electrode 302 from the bottom electrode 304 as physically separate devices. These electrodes 302, 304 may also be referred to herein as a "first" (i.e., top) electrode and a "second" (i.e., bottom) electrode to emphasize that their relative position is not limited.

The selector device 110 may also include a separator 306 between the top electrode 302 and the bottom electrode 304. In some embodiments, the separator 306 may include a mixed ionic-electronic conduction (MIEC) material in which both the ionic and electronic species conduct electricity. While any MIEC material may be used in various embodiments, some embodiments use germanium telluride (GeTe) as a separator material. The separator 306 may be a transitional metal oxide (TMO) with high ionic conductivity such as $TiO_x$, $HfO_2$, $Ta_2O_5$ and similar. The separator 306 may also include mobile ions 308 that have an electrical charge. For example, $Cu^+$ ions may be mobile within the separator 306. The interstitials/vacancies of the ions 308 can act as dopants in the separator 306. The ions 308 may have a charge, which may be referred to as a "first" charge to distinguish the polarity of the ions 308 from the polarities of other ions described below. The ions 308 may also be referred to as "first" ions to distinguish these ions 308 from other ions described below. Again, the terms "first/second" are used merely to distinguish these ions/charges from other ions/charges in this disclosure. These terms are not meant to imply order, importance, or any other limitation upon the placement, type, and/or material used for the ions 308.

Figure 3B:
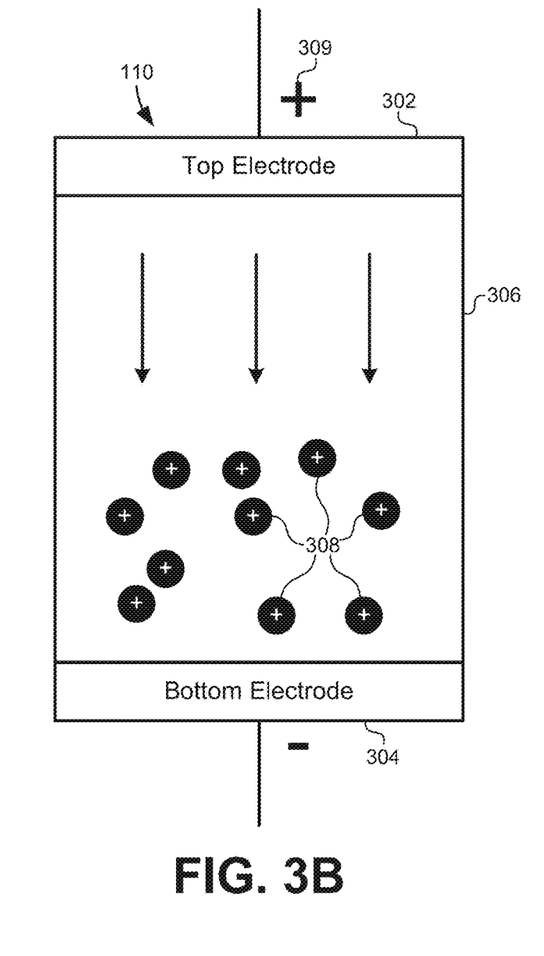
FIG. 3B illustrates a simplified diagram of the selector device when a voltage is applied to the selector device, according to some embodiments.

FIG. 3B illustrates a simplified diagram of the selector device 110 when a voltage 309 is applied to the selector device 110, according to some embodiments. The voltage 309 may be applied across the top electrode 302 and the bottom electrode 304. In this example, the top electrode 302 may be at a higher potential than the bottom electrode 304 such that the voltage differential is positive when viewed from the top electrode 302 to the bottom electrode 304. This voltage 309 may also be described as being the same as the charge of the ions 308 in relation to the top electrode 302.

When the voltage 309 is applied to the selector device 110, the electric field induced in the separator 306 causes the ions 308 to move away from the top electrode 302 towards the bottom electrode 304. As the voltage 309 is applied, the positive voltage at the top electrode 302 repels the positive charge of the ions 308 away from the top electrode 302. The opposite would be true using a negative voltage and/or negative ions in other embodiments. As the ions 308 move towards the bottom electrode 304, the selector device 110 may conduct and allow a memory device coupled to the bottom electrode 304 to execute a read/write operation. Afterwards, in an ideal device, the ions 308 will move back to their original locations in the separator 306 when the voltage 309 is no longer applied.

Figure 3C:
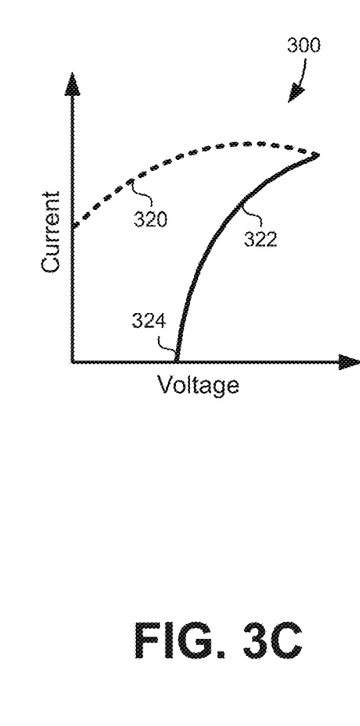
FIG. 3C illustrates ideal and actual response curves for the selector device, according to some embodiments.

FIG. 3C illustrates ideal and actual response curves for the selector device 110, according to some embodiments. Curve 322 represents an ideal response curve as voltage is applied to the selector device 110. After a threshold voltage 324 is received, the selector device may begin conducting current, which may increase as the voltage increases as illustrated by curve 322. In an ideal device, as the voltage is reduced, the current will decrease back to the threshold voltage 324, at which point the device will stop conducting. Thus, ideal devices will perform the same as voltage is applied and removed from the device.

Curve 320 represents a portion of the actual response curve for the selector device 110. Assuming that the response is ideal as voltage is increased past the threshold voltage 324, the actual current response will increase as the voltage increases according to curve 322. However, as voltage is removed from the selector device 110, the current may instead follow the trajectory of curve 320 instead of curve 322. In other words, the selector device may be slower to turn off when voltage is removed, thus allowing current to continue flowing at a relatively high level for a time interval as the voltage is lowered. This effect is caused when the ions 308 in FIG. 3B fail to quickly return to near their original positions in the separator 306. As the voltage 309 is removed, the ions 308 typically do not immediately return. Additionally, the location and rate at which the ions 308 return after the voltage 309 is removed may be different each time the selector device 110 is used. This means that a standard selector device 110 may still allow high leakage currents at the $V_{DD}/2$ level, and may have response curves that cannot be accurately repeated with each use.

Figure 4A:
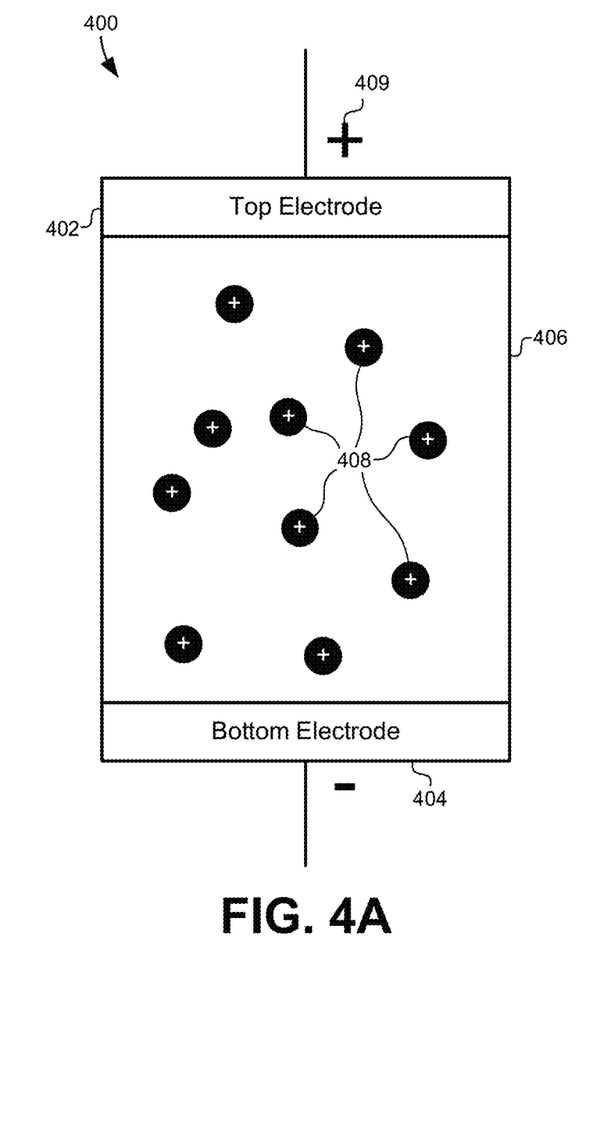
FIG. 4A illustrates a selector device that uses different materials for the top electrode and the bottom electrode, according to some embodiments.

The embodiments described herein provide a new design for the selector devices used in memory arrays that overcome these problems to provide a low-leakage, repeatable, tunable selector device. FIG. 4A illustrates a selector device 400 that uses different materials for the top electrode 402 and the bottom electrode 404, according to some embodiments. Instead of using the same conductive material for both the top electrode 402 and the bottom electrode 404, some embodiments may use different materials. Materials that may be used for each are described below. Using different materials for the top electrode 402 and the bottom electrode 404 means that each of the electrodes 402, 404 may be associated with different electrical work functions. Even though structurally the device 400 resembles the cells having a symmetric work function, energetically the asymmetry and the field generation can be observed in the band diagrams in FIG. 4B that illustrate allowed and non-allowed energetic states of electrons in the device. These different work functions may generate an electric field across the separator 406 even when a voltage is not applied to the selector device 400. For example, the work function at the top electrode 402 may be 5.2 eV, and the work function at the bottom electrode 404 may be 4 eV for a difference of 1.2 eV, which may generate an electric field across the device. The field may depend on the difference—which in this case is approximately 1.2 eV—and thickness of the separator. This may be used as a design rule that can be used by circuit designers to tailor the required electric field to better match with the corresponding memory element.

Figure 4B:
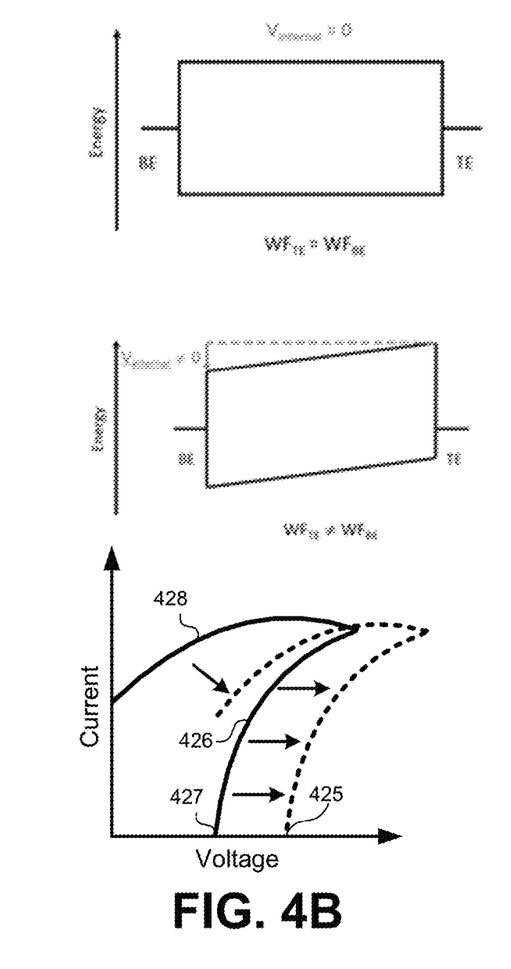
FIG. 4B illustrates changes to the response curve of the selector device.

The electric field and induced charges generated by the work function differential can affect the shape of the response curve for the selector device 400. FIG. 4B illustrates changes to the response curve 426 of the selector device 400. First, the electric field can be generated to oppose the direction of the electric field induced by an applied voltage 409. Thus, more voltage may need to be applied across the top electrode 402 and the bottom electrode 404 before the selector device 400 will begin conducting. This is illustrated in FIG. 4B as the entire curve 426 is shifted to the right. The threshold voltage 427 has shifted to a new, higher threshold voltage 425. This allows a circuit designer to tune the threshold voltage of the selector device 400. Turning back to FIG. 2, this allows the circuit designer to adjust the conductive area of the selector device 400 such that the high-current regions are all above the voltage 209 that may be experienced incidentally in the memory array.

The electric field induced by the work function difference may also cause the shape of the return curve 428 to curve more towards curve 426. Because the electric field opposes the direction of the voltage 409, once the voltage is removed, the electric field may push the ions 408 away from the bottom electrode 404 and attract them towards the top electrode 402. This causes the ions 408 to return to near their original positions faster, thus making this portion of the response curve more closely approach the ideal.

Figure 5:
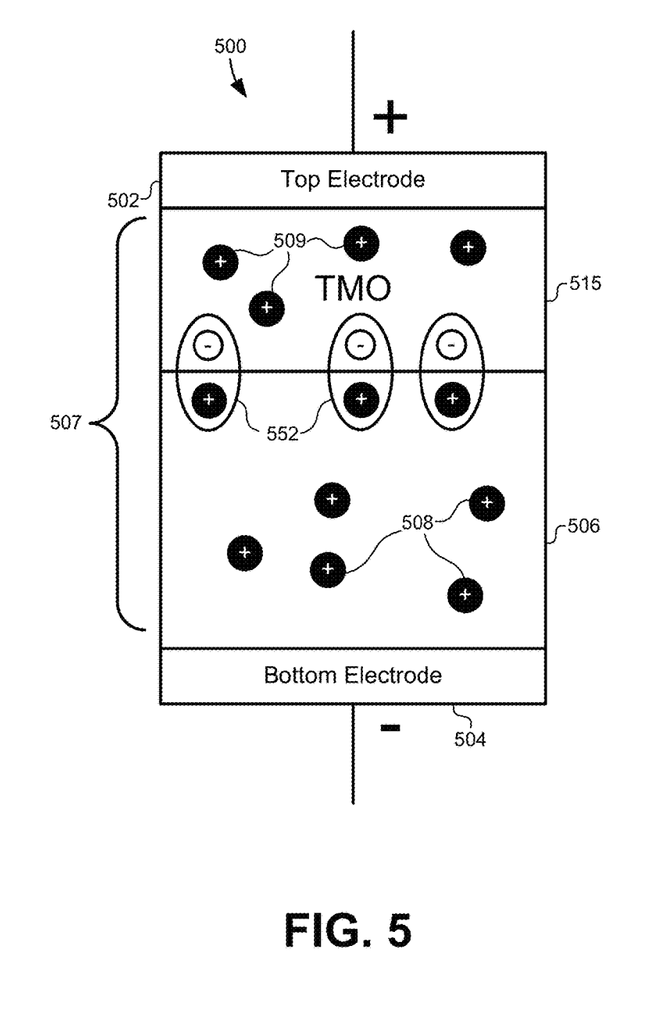
FIG. 5 illustrates an alternative method of inducing an electric field in a selector device, according to some embodiments.

FIG. 5 illustrates an alternative method of inducing an electric field in a selector device 500, according to some embodiments. The top electrode 502 and the bottom electrode 504 of the selector device 500 may use the same conductive material, or alternatively may use different materials having different work functions as described above. The separator 507 may include two different regions 506, 515. A first region 506 may use a classical MIEC material as described above, such as GeTe or its alloys, or a transition metal oxide (TMO) material having high ionic mobility (e.g., $Ta_2O_5$, $HfO_x$, $TiO_x$, or other similar materials). A second region 515 may use a transition metal oxide (TMO) material having high mobility (e.g., $TiO_x$, $HfO_2$, $Al_2O_3$, $SiO_2$). These two regions 506, 515 may have an interface within the separator 507.

The first region 506 and the second region 515 may have a different number of defects per volume in their respective materials. For example, the second region of separator 515 may include more vacancies and/or carriers than the first region of separator 506. The difference in surface concentration of oxygen vacancies along the interface between the second region 515 and the first region 506 may cause dipoles 552 to form at the interface between the second region 515 and the first region 506. These dipoles can be used to generate the attraction force which can work in conjunction with the work function differential described above to pull the ions 508, 509 back to near their initial positions in the separator 506. The combination of the dipole strength and the work function differential can generate electric fields that may be used to fine-tune the rate at which the ions 508, 509 return. Using these two methods together also allow for a large variety of materials to be used in the TMO of the second region 515 and in the top and bottom electrodes 502, 504. The MIEC portion of the separator and the regular barrier portion of the separator may invert their positions to secure the right direction of the dipole and enable usage of even negative ion species such that this may be used as a design rule for a circuit designer.

Figure 6A:
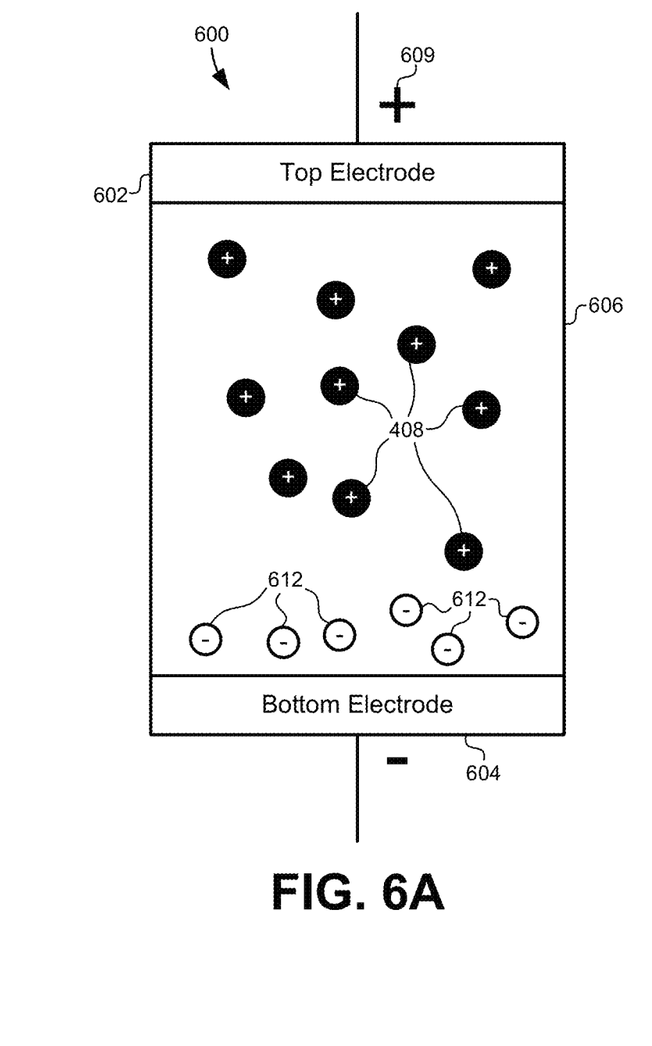
FIG. 6A illustrates a selector device with a separator that is doped with heavy ions or oxygen vacancies.

Some embodiments may also dope the separator with heavy ions, induce oxygen vacancies, or induce fixed charges to help attract free ions that improve the speed of return in the hysteresis curve of the selector device. FIG. 6A illustrates a selector device 600 with a separator 606 that is doped with heavy ions 612. These ions 612 may also be referred to as "second" ions to distinguish them from the "first" ions 408 that move freely in the separator 606. The ions 612 may have a charge that is the opposite of the charge of the ions 408. In this example, the ions 408 have a positive charge, while the ions 612 have a negative charge.

The location at which the separator 606 is doped with the ions 612 may be determined based on the charge of the ions 408 and the direction of a voltage 609 applied across the top electrode 602 and the bottom electrode 604. The separator 606 can be doped with the heavy ions or induced oxygen vacancies 612 in the bottom half of the separator 606. In this example, the ions 612 are chosen to be negatively charged to improve the variability of the selector, the repeatability of the selector, and to improve the slope (i.e., the nonlinearity of the characteristics). This doping also improves the faster return of ions to their initial state once the external voltage magnitude is reduced. Essentially, the work function difference between the top electrode 602 in the bottom electrode 604 would cause the positive ions 408 to drift towards the top electrode 602. The negative ions 612 pull the positive ions 680 towards the bottom electrode 604.

The term "near" may refer to doping the separator 606 within the 20%-40% of the separator 606 nearest to the bottom electrode 604. For example, some embodiments may use a separator 606 that is approximately 10 nm thick, meaning that the separator 606 may be doped with the ions 612 in the 3 nm or more of the separator 606 that are closest to the bottom electrode 604. Many different types of ions 612 may be used to dope the separator 606. In some embodiments, the ions 612 may have more mass than the ions 408. For example, the ions 612 may have at least twice the mass of the ions 408. This may allow the ions 612 to remain relatively fixed at their locations in the separator 606, while the smaller ions 408 move freely in response to the applied voltage 609. Doping the separator 606 with the ions 612 may be carried out using processes such as ionic implantation, deposition, and/or sputter-deposition.

Figure 6B:
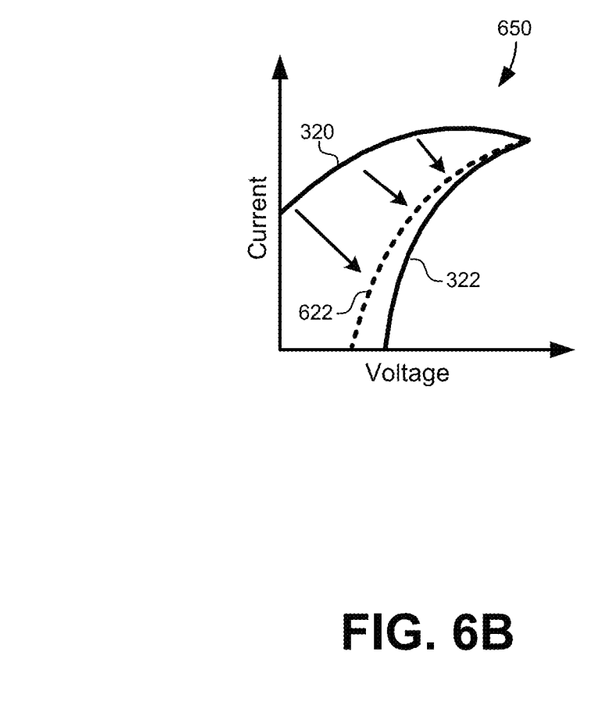
FIG. 6B illustrates the effect that ion-doping the separator has on the response curve for the selector device, according to some embodiments.

FIG. 6B illustrates the effect that ion-doping the separator 606 has on the response curve 650 for the selector device 600, according to some embodiments. Once the voltage 609 is removed from the selector device 600, the presence of the ions 612 and the work function difference between the top electrode 602 and the bottom electrode 604 rapidly pulls the ions 408 back towards the top electrode 606 to recover from the applied voltage 609. Because the charge of the ions 612 is opposite of the charge of the ions 408, the ions 612 will attract the ions 408 once the voltage 609 is removed. This causes the return portion of the previously unideal curve 320 to move towards ideal curve 322 as shown with 622. The practical effect of this movement is to reduce the current faster as the voltage is reduced. Turning back to FIG. 2, a circuit designer may adjust the amount of ionic doping or the strength of the dipole in case of FIG. 5 in the separator to ensure that the current of curve 204 drops down to acceptable levels before voltage 209 is reached. This ensures that the leakage current remain small when a voltage below voltage 209 is applied by a word line or bit line when reading/writing another memory cell in the same row/column.

Figure 7A:
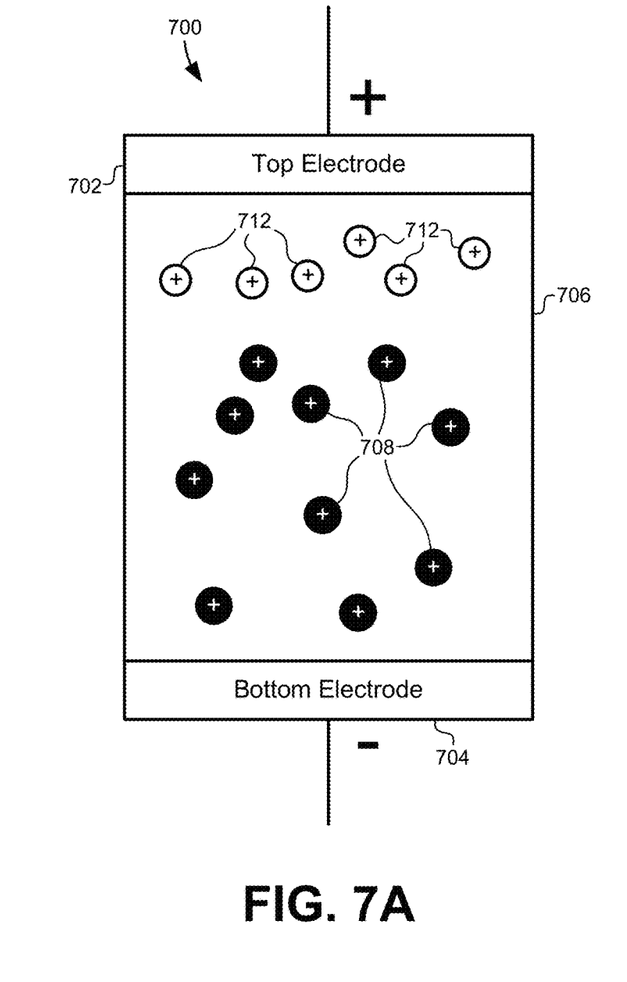
FIG. 7A illustrates an example of doping an opposite side of a separator in a selector device, according to some embodiments.

FIG. 7A illustrates an example of doping an opposite side of a separator 706 in a selector device 700, according to some embodiments. Instead of applying ions with an opposite charge near the bottom electrode 704, this embodiment may dope the bottom portion of a separator 706 near the top electrode 702. Ions 712 used in this doping process may include a charge that is the same as a charge of the mobile ions 708 that move in the separator 706 in response to an applied voltage. The effect of the ions 712 may be similar to the ions 612 from FIG. 6A. Specifically, the fixed ions 712 may cause the moving ions 708 to return to their original positions faster once the applied voltage is removed. Instead of pulling the moving ions 708 back towards the bottom electrode 704, the fixed ions 712 may push the moving ions 708 away from the top electrode 702. The effects of these two embodiments may be similar as illustrated in FIG. 6B by pulling the return curve 320 down towards the ideal curve 322 after the voltage is removed.

Figure 7B:
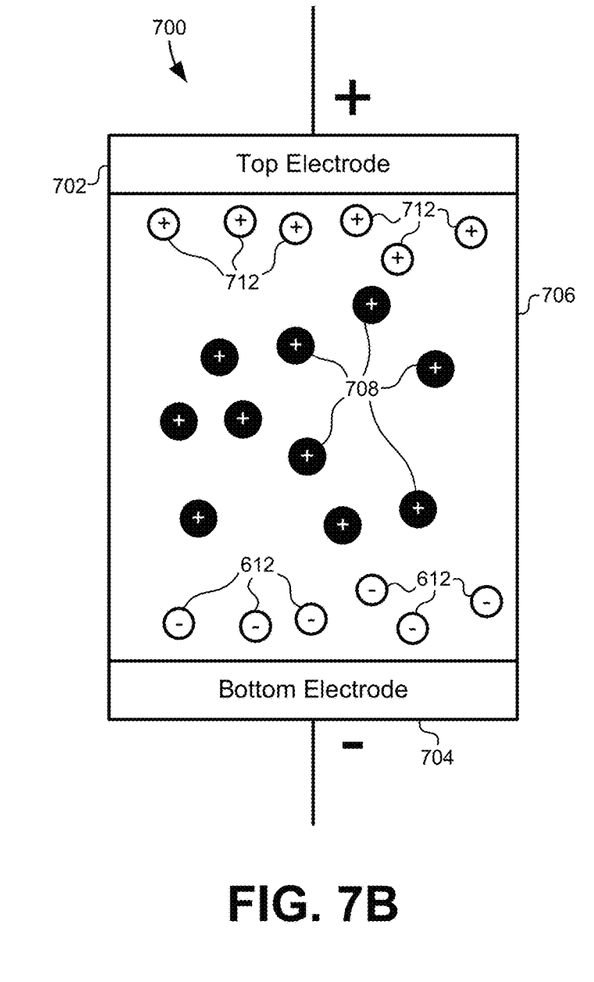
FIG. 7B illustrates an example of doping both sides of a separator for unipolar operation, according to some embodiments.

FIG. 7B illustrates an example of doping both sides of a separator 706 for unipolar operation, according to some embodiments. This embodiment is a combination of the embodiments illustrated in FIG. 6A and FIG. 7A. The separator 706 is doped with ions 712 having a charge that is the same as the free-moving ions 708 near the top electrode 702, while the separator 706 is doped with fixed ions 612 having a charge that is the opposite of the moving ions 708 near the bottom electrode 704. This arrangement may generate an electric field similar to the work function differential described above. This arrangement may also provide both a push and a pull on the moving ions 708 to accelerate recovery after a voltage is removed. Note that the ions 712 in FIGS. 7A-7B are optional, as the primary driver is the work function difference. However, they are provided here as an option to the circuit designer.

Figure 8:
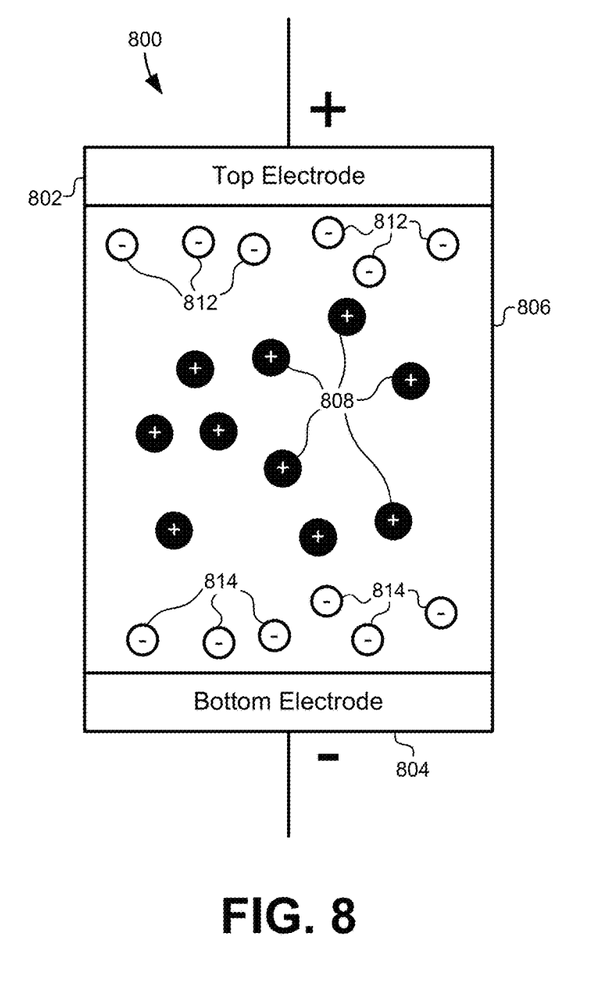
FIG. 8 illustrates the doping of a separator in a bipolar selector device, according to some embodiments.

FIG. 8 illustrates the doping of a separator 806 in a bipolar selector device 800, according to some embodiments. Bipolar operation of the selector device 800 may occur when voltages are applied in both polarities across a top electrode 802 and a bottom electrode 804 and should be used in case a bipolar memory element underneath is used. For example, the embodiments described above primarily illustrate a positive voltage being applied from the top electrode 802 to the bottom electrode 804. Bipolar embodiments may also apply negative voltages from the top electrode 802 to the bottom electrode 804. Therefore, in bipolar embodiments, moving ions 808 in the separator 806 may be pulled in both directions, towards the top electrode 802 and towards the bottom electrode 804, depending on the direction of the applied voltage.

Doping the separator 806 may be used to accelerate ion recovery in both directions in these bipolar embodiments. As illustrated in FIG. 8, oppositely charged fixed ions and/or charges 812 can be deposited in the separator 806 near the top electrode 802. Similarly, oppositely charged fixed ions and/or charges 814 can also be deposited in the separator 806 near the bottom electrode 804. Therefore, when a positive voltage is applied from the top electrode 802 to the bottom electrode 804, the moving ions 808 may be pushed towards the bottom electrode 804 as described above. The fixed ions or fix charges 814 near the bottom electrode 804 can push the moving ions 808 back towards the top electrode 802. When a negative voltage is applied from the top electrode 802 to the bottom electrode 804, the moving ions 808 may be pushed towards the top electrode 802 instead of the bottom electrode 804. When the negative voltage is removed from the selector device 800, the fixed ions or fix charges 812 near the top electrode 802 can pull the moving ions 808 back towards the bottom electrode 804. Therefore, doping both sides of the separator 806 may be used to accelerate the recovery of the moving ions 808 in response to voltages applied in either direction. Turning back to FIG. 5 with the fixed-charge generation at the interface, the same approach can be followed here to generate a 3-layer separator with TMOs on the outer portion of the separator and MIEC material in the middle of the separator.

Thus far this disclosure has discussed two methods for optimizing the response of a selector device. A circuit designer may select different materials for the top electrode and the bottom electrode to cause a work function differential and induce an electric field across the device to move the threshold voltage and to increase the rate of ion recovery. Additionally, a circuit designer may dope the separator in various location using ions to accelerate the ion recovery and cause the operation of the device to be more repeatable and predictable.

Figure 9A:
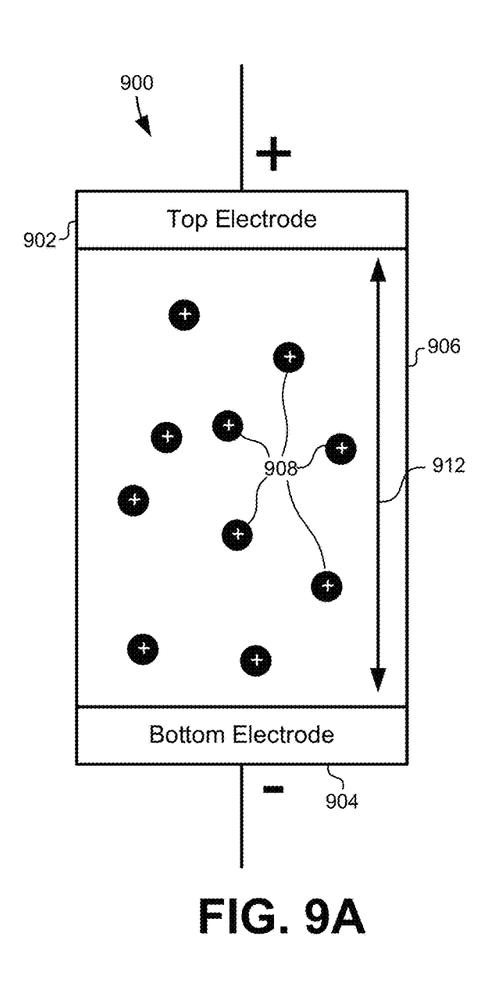
FIG. 9A illustrates a selector device with a separator having a first thickness, according to various embodiments.

Some embodiments may also include an additional method of optimizing the selector response that includes adjusting a thickness of the separator. FIG. 9A illustrates a selector device 900 with a separator 906 having a first thickness 912. For example, the first thickness 912 may be approximately 10 nm. The first thickness 912 may be measured from a top electrode 902 to a bottom electrode 904. This selector device 900 may be similar in thickness to the selector devices described above. FIG. 9C illustrates a graph of response curves for selector device, according to various embodiments. Curve 952 may represent the response of the selector device 900 in FIG. 9A. The leakage current at voltage 956 is below the leakage current of curve 950 that would result from a device without the modifications described above.

Figure 9B:
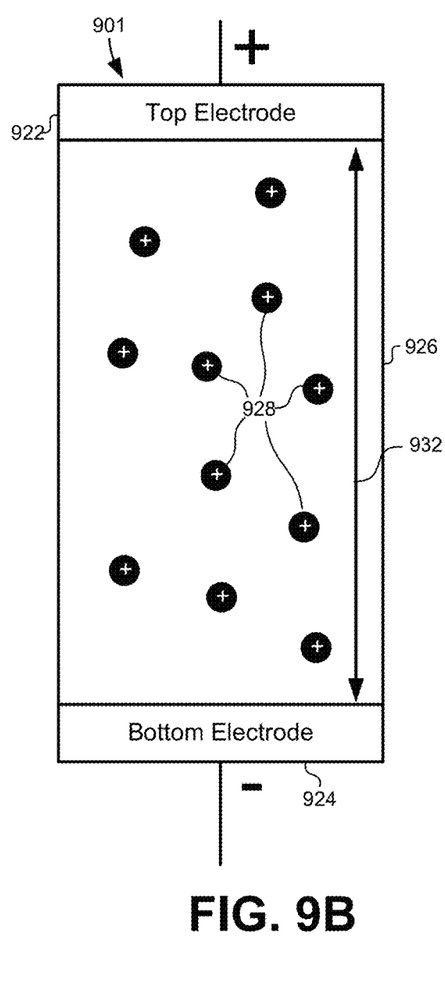
FIG. 9B illustrates a selector device with a separator having a second thickness, according to various embodiments.
Figure 9C:
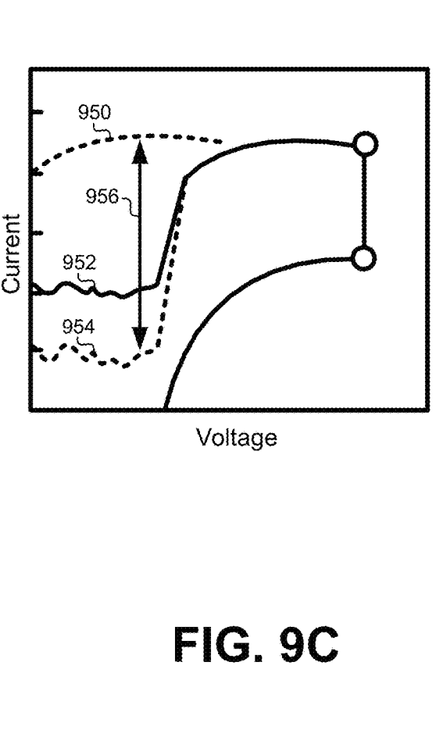
FIG. 9C illustrates a graph of response curves for selector device, according to various embodiments.

FIG. 9B illustrates a selector device 901 with a separator 926 having a second thickness 932. For example, some embodiments may increase the second thickness 932 to be between approximately 13 nm and 25 nm. Curve 954 in FIG. 9C shows the response of the selector device 901 using the increased second thickness 932. In this example, the leakage current 954 of the device at voltage 956 has been pulled lower than the leakage current of curve 952 for selector device 900. Therefore, increasing the thickness of the separator 926 may reduce the current that is allowed to flow through the selector device 901 after a voltage is removed from the selector device 901. A circuit designer may choose a separator thickness in order to reduce the current to a proper level based on the needs of an associated memory array.

Figure 10:
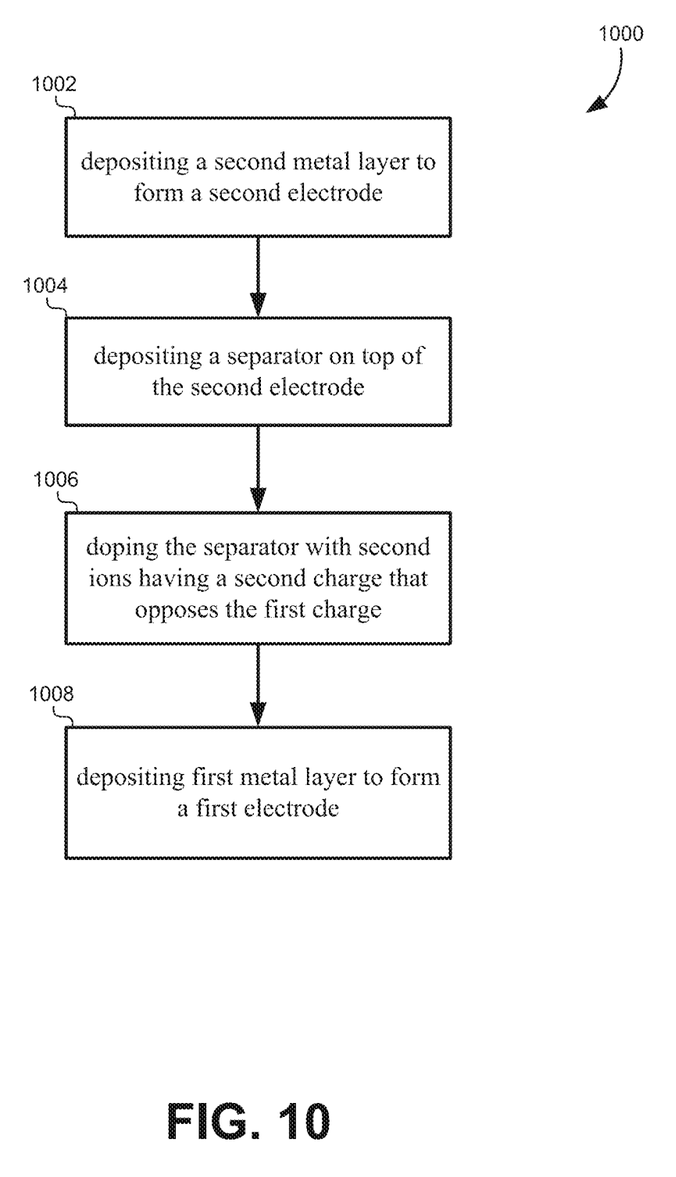
FIG. 10 illustrates a flowchart of a method for implementing a selector device for a memory cell in a memory array, according to some embodiments.

FIG. 10 illustrates a flowchart of a method 1000 for implementing a selector device for a memory cell in a memory array, according to some embodiments. The method may include depositing a second metal layer to form a second electrode (1002). As described above, the "second" electrode may refer to the bottom electrode. The second electrode may also refer to the first electrode deposited onto a semiconductor device during a fabrication process such that other layers (e.g., a separator, a top electrode, etc.) are deposited on top of the second electrode. The second electrode may be deposited using an atomic layer deposition (ALD) process, a physical vapor deposition (PVD) process, or other processes that may accomplish the same result. As described above, the second electrode may be implemented using a first conductive material that is associated with a first work function. The second electrode may be formed using the materials such as Ti, TiN, TiSi, TiAlN, TaN, TaCN, TaSi, W, WSi, WN, Al, Ru, RuO, RuO2, Re, Pt, Ir, IrO, IrO2, In2O3, InSnO, SnO, ZnO, Ti, Ni, NiSi, Nb, Ga, GaN, C, Ge, Si, doped Si, SiC and GeSi, and/or the like The thickness of the second electrode may be between approximately 7 nm and approximately 50 nm.

The method may also include depositing a separator on top of the second electrode (1004). In some embodiments, the separator may be deposited as one or more separator layers. For example, GeTe layers may be deposited using a PVD process to form a separator having a desired thickness. As described above, the thickness of the separator may be tailored to optimize the response curve of the selector device. The separator may be deposited using materials such as $Ta_2O_5$, $HfO_x$, $TiO_x$, $AlO_2$, $SiO_2$, and/or the like. The separator may be deposited to be any thickness between approximately 5 nm and approximately 30 nm. For example, separators of various embodiments may include thicknesses of 10 nm, 13 nm, 17 nm, 20 nm, 25 nm, and/or the like. A separator thickness of between approximately 13 nm and approximately 17 nm may be used to decrease the leakage current. Some embodiments may use a separator thickness above approximately 17 nm to decrease the leakage current. The separator may also include first ions that are able to move in the separator material in response to an applied voltage across the separator. Once the applied voltages are removed, these first ions may tend to return towards their initial positions over time. Some embodiments may use a separator material that is characterized as a MIEC material. These moving ions may be applied by sputtering and may include ions such as oxygen ions, Cu ions, and/or the like.

The method may also include doping the separator with second ions (1006). Some embodiments may dope the separator with the second ions near the second electrode. Some embodiments may additionally or alternatively dope the separator with second ions near an end of the separator opposite of the second electrode (e.g., near a first electrode described below). The doped ions may have a charge that is opposite of the free-moving ions in the separator. The doped ions may have a mass that is significantly more than the mass of the free-moving ions in the separator. For example, the doped ions may have a mass that is two times more, three times more, four times more, five times more, 10 times more, 15 times more, 25 times more, and/or 30 times more than the mass of the moving ions. The concentration of the ion doping may be between approximately 1e15 per $cm^3$ and approximately 1e25 per $cm^3$, and may include values such as 1e19 per $cm^3$ or 1e20 per $cm^3$. The doping of the fixed ions may be accomplished using ion implantation such that their location can be precisely controlled.

The method may also include depositing a first metal layer to form a first electrode (1008). The first electrode may include the top electrode described above. The first electrode may also refer to an electrode deposited on top of the separator during a fabrication process. Some embodiments may use a material for the first electrode that is different from a material used for the second electrode, thereby causing a work-function differential to induce an electric field across the selector device as described above. The thickness of the top electrode may be between approximately 7 nm and approximately 50 nm. The top electrode may use materials such as Ti, TiN, TiSi, TiAlN, TaN, TaCN, TaSi, W, WSi, WN, Al, Ru, RuO, RuO2, Re, Pt, Ir, IrO, IrO2, In2O3, InSnO, SnO, ZnO, Ti, Ni, NiSi, Nb, Ga, GaN, C, Ge, Si, doped Si, SiC and GeSi, and/or the like. Note the combination of top and bottom electrodes may have different work functions as described above.

After adding the top electrode, some embodiments may include an additional initiation step for activating the dopant. This step may be optional depending on the dopant used.

It should be appreciated that the specific steps illustrated in FIG. 10 provide particular methods of implementing a selector device for a memory cell in a memory array according to various embodiments. Other sequences of steps may also be performed according to alternative embodiments. For example, alternative embodiments may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A selector device for a memory cell in a memory array, the selector device comprising:
    a first electrode;
    a separator comprising:
        a first region comprising a single-composition layer of a mixed ionic-electronic conduction material with a first concentration of defects; and
        a second region comprising a single-composition layer of a transitional metal oxide with a second concentration of defects that is different from the first concentration of defects, wherein an interface between the first region and the second region is configured to form dipoles; and
    a second electrode, wherein the separator is between the first electrode and the second electrode.

2. The selector device of claim 1, wherein the first region comprises germanium telluride.

3. The selector device of claim 1, wherein the second region comprises titanium oxide.

4. The selector device of claim 1, wherein the separator comprises mobile ions, and the dipoles generate an electric field that moves the mobile ions back to a neutral position when a voltage applied across the first electrode and the second electrode is removed.

5. The selector device of claim 1, wherein a non-volatile memory cell is coupled to the selector device in a memory array.

6. The selector device of claim 5, wherein the non-volatile memory cell comprises a resistive random-access memory (ReRAM).

7. The selector device of claim 1, wherein
    the first electrode comprises a first metal; and
    the second electrode comprises a second metal that is different from the first metal.

8. The selector device of claim 7, wherein:
    the first metal has a first work function; and
    the second metal has a second work function that is different from the first work function.

9. The selector device of claim 8, wherein a difference between the first work function and the second work function causes an electric field between the first electrode and the second electrode that opposes a voltage applied between the first electrode and the second electrode.

10. The selector device of claim 9, wherein a difference between the first work function and the second work function causes a voltage at which the selector device begins to conduct to increase.

11. A method of implementing a selector device for a memory cell in a memory array, the method comprising:
    forming a first metal layer to form a first electrode;
    forming a separator on top of the first electrode, wherein the separator comprises:
        a first region comprising a single-composition layer of a mixed ionic-electronic conduction material with a first concentration of defects; and
        a second region comprising a single-composition layer of a transitional metal oxide with a second concentration of defects that is different from the first concentration of defects, wherein an interface between the first region and the second region is configured to form dipoles; and
    forming a second metal layer to form a second electrode.

12. The method of claim 11, wherein a thickness of the separator is selected based on an amount by which a leakage current is to be reduced through the selector device.

13. The method of claim 11, wherein:
    the first electrode comprises a first metal; and
    the second electrode comprises a second metal that is different from the first metal.

14. The method of claim 11, wherein a non-volatile memory cell is coupled to the selector device in a memory array.

15. The method of claim 14, wherein the non-volatile memory cell comprises a resistive random-access memory (ReRAM).

16. The method of claim 14, wherein the memory array comprises at least one write line electrically coupled to the first electrode, and at least one bit line electrically coupled to the second electrode such that a voltage applied between the first electrode and the second electrode is supplied by the at least one write line and the at least one bit line.

\* \* \* \* \*